(12) United States Patent
Uejima (10) Patent No.: US 9,071,227 B2
(45) Date of Patent: Jun. 30, 2015

(54) HIGH-FREQUENCY MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: Murata Manufacturing Co. Ltd., Kyoto (JP)

( * ) Notice: Subject to any disclaimer, the term of this patent is extended or adjusted under 35 U.S.C. 154(b) by 283 days.

(21) Appl. No.: 13/749,954

(22) Filed: Jan. 25, 2013

(65) Prior Publication Data
US 2013/0141180 A1 Jun. 6, 2013

Related U.S. Application Data

(63) Continuation of application No. PCT/JP2011/065432, filed on Jul. 6, 2011.

(30) Foreign Application Priority Data

Jul. 27, 2010 (JP) .................................. 2010-167654

(51) Int. Cl.
*H03H 9/72* (2006.01)
*H03H 7/42* (2006.01)
(Continued)

(52) U.S. Cl.
CPC ......... *H03H 7/42* (2013.01); *H03H 2001/0085* (2013.01); *H04B 1/48* (2013.01);
(Continued)

(58) Field of Classification Search
CPC .................. H03H 7/42; H03H 7/0123; H03H 2009/0019; H03H 9/0028; H03H 9/725; H03H 2001/0085; H04B 1/0057; H04B 1/006; H04B 1/0458; H04B 1/18; H04B 1/48

USPC ......... 333/133, 193, 195, 101, 126, 129, 132; 455/78, 82, 83; 370/276, 278, 282, 297
See application file for complete search history.

(56) References Cited

U.S. PATENT DOCUMENTS

| 4,435,848 | A  | * | 3/1984 | Sedlmair ....................... 455/327 |
| 7,696,842 | B2 | * | 4/2010 | Uejima et al. ................. 333/133 |

(Continued)

FOREIGN PATENT DOCUMENTS

| JP | 2008-017439 A | 1/2008 |
| JP | 2008-271421 A | 11/2008 |

(Continued)

OTHER PUBLICATIONS

Official Communication issued in International Patent Application No. PCT/JP2011/065432, mailed on Aug. 30, 2011.
(Continued)

*Primary Examiner* — Barbara Summons
(74) *Attorney, Agent, or Firm* — Keating & Bennett, LLP (57) ABSTRACT

A high-frequency module has a structure including balanced terminals, with high design flexibility and good transmission characteristics. Wiring patterns to be connected to balanced terminals of SAW filters of SAW duplexers are located on a second layer to a sixth layer of a layered body. The characteristic impedances of first wiring patterns defining a pair of parallel or substantially parallel lines match, the characteristic impedances of second wiring patterns defining a pair of parallel or substantially parallel lines match, the characteristic impedances of third wiring patterns defining a pair of parallel or substantially parallel lines match, and the characteristic impedances of fourth wiring patterns defining a pair of parallel or substantially parallel lines match.

19 Claims, 5 Drawing Sheets

(51) Int. Cl.
  *H04B 1/48* (2006.01)
  *H04B 1/00* (2006.01)
  *H04B 1/04* (2006.01)
  *H04B 1/18* (2006.01)
  *H03H 1/00* (2006.01)
  *H03H 7/01* (2006.01)

(52) U.S. Cl.
  CPC ............ *H03H 9/725* (2013.01); *H03H 7/0123* (2013.01); *H04B 1/0057* (2013.01); *H04B 1/006* (2013.01); *H04B 1/0458* (2013.01); *H04B 1/18* (2013.01)

(56) References Cited

U.S. PATENT DOCUMENTS

2003/0157906 A1* 8/2003 Suzuki et al. ................. 455/107
2005/0088252 A1* 4/2005 Burns et al. .................... 333/26
2008/0122554 A1* 5/2008 Harada et al. ................... 333/25
2008/0191812 A1* 8/2008 Uejima et al. ................. 333/101
2008/0212552 A1  9/2008 Fukamachi et al.
2008/0218927 A1  9/2008 Harada et al.
2009/0206956 A1* 8/2009 Tsutsumi et al. .............. 333/204
2011/0260806 A1* 10/2011 Takeuchi ....................... 333/103
2012/0274413 A1* 11/2012 Tseng ............................ 333/100

FOREIGN PATENT DOCUMENTS

| | | |
|---|---|---|
| JP | 2009-124746 A | 6/2009 |
| WO | 2006/070616 A1 | 7/2006 |
| WO | 2010/052969 A1 | 5/2010 |
| WO | 2010/053131 A1 | 5/2010 |

OTHER PUBLICATIONS

Official Communication issued in corresponding German Patent Application No. 11 2011 102 499.1, mailed on Dec. 18, 2013.

* cited by examiner

HIGH-FREQUENCY MODULE

BACKGROUND OF THE INVENTION

1. Field of the Invention

The present invention relates to a high-frequency module that transmits and receives a plurality of communication signals having different frequency bands using a common antenna, and more specifically to a high-frequency module whose reception signal output terminals for the respective communication signals are constituted by balanced terminals.

2. Description of the Related Art

In the related art, there have been devised various high-frequency modules that transmit and receive a plurality of communication signals having different frequency bands using a common antenna. In such high-frequency modules, for example, as described in Japanese Unexamined Patent Application Publication No. 2009-124746, a common terminal of a switch IC is connected to a common antenna, and a transmission signal input terminal and a reception signal output terminal of a high-frequency module are connected to a plurality of individual terminals of the switch IC.

Some of the high-frequency modules of the related art have a structure in which a SAW duplexer is connected to one individual terminal of the switch IC. In a high-frequency module of this type, reception signals that are two types of communication signals are output from one individual terminal, and are separated by a SAW duplexer so that a reception signal that is each communication signal is output from a different terminal of the high-frequency module.

In a high-frequency module having such a configuration, balanced terminals are often used as reception signal output terminals in accordance with the configuration or the like of a signal processing circuit in a subsequent stage.

Figure 1A:
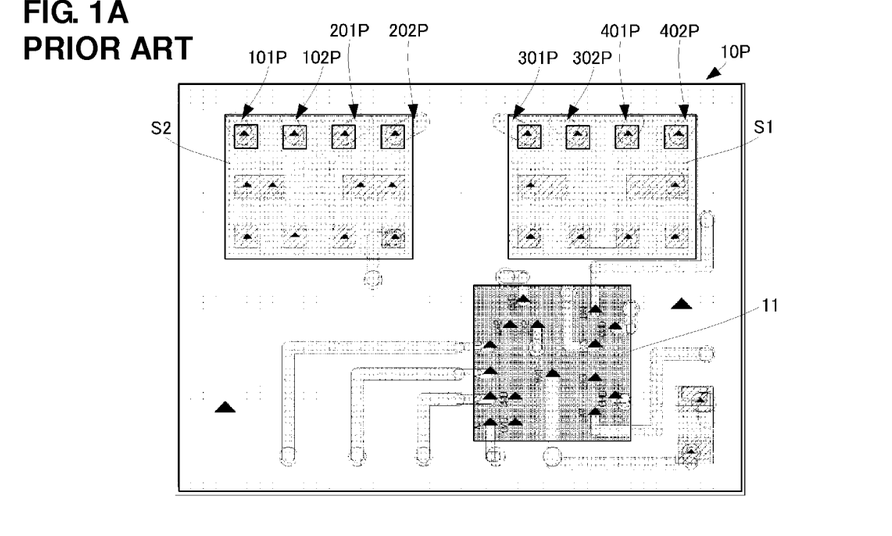
FIGS. 1A and 1B include a diagram illustrating wiring patterns for SAW duplexers of a high-frequency module of the related art, and diagrams illustrating the amplitude characteristics and phase characteristics of the high-frequency module of the related art.

In such a case where balanced terminals are used, a wiring pattern is set so that the phase difference between signals output from two terminals constituting the balanced terminals becomes 180°. In the related art, therefore, a wiring pattern as illustrated in FIG. 1A has been used. FIG. 1A is a diagram illustrating a wiring pattern for a SAW duplexer in a high-frequency module of the related art, and FIG. 1B includes graphs illustrating the amplitude characteristics and phase characteristics of a SAW duplexer alone in a high-frequency module having a structure of the related art and of the module.

Figure 1B:
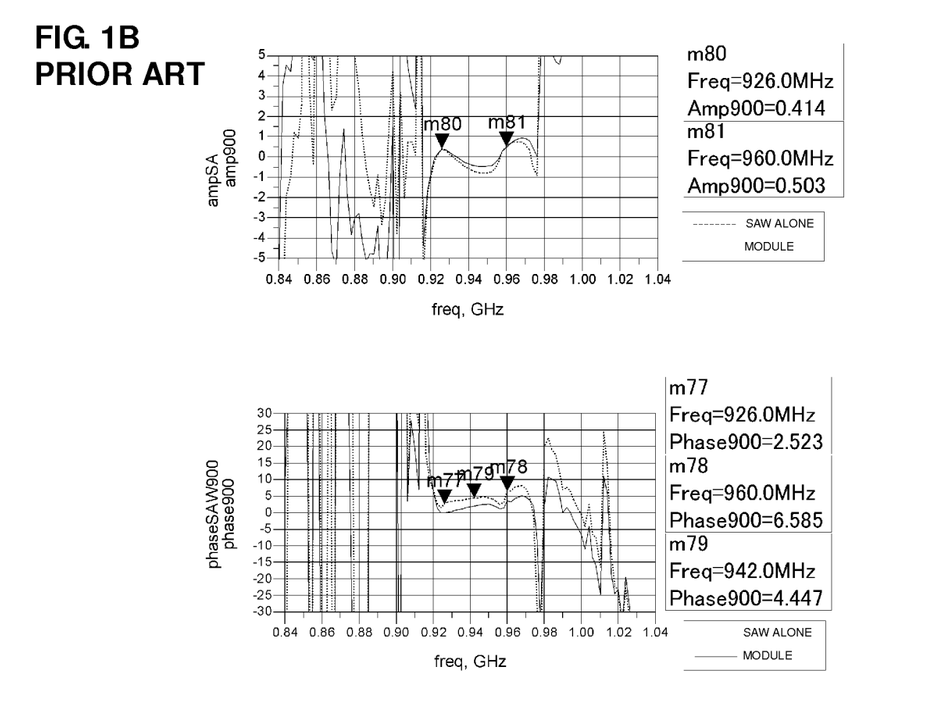

FIG. 1B illustrates the characteristics of a GSM 900 communication signal, where the phase characteristics are "0" when the phase difference between signals output from two balanced output terminals is 180°.

As illustrated in FIG. 1A, wiring patterns 101P and 102P which form one balanced output from a SAW duplexer S2 have the same line width and the same line length and are formed in parallel. Also, wiring patterns 201P and 102P which form the other balanced output from the SAW duplexer S2 have the same line width and the same line length, and are formed in parallel. In addition, wiring patterns 301P and 302P which form one balanced output from a SAW duplexer S1 have the same line width and the same line length, and are formed in parallel. Also, wiring patterns 401P and 402P which form the other balanced output from the SAW duplexer S1 have the same line width and the same line length, and are formed in parallel.

However, as in the related art, if a pair of wiring patterns which are routing patterns for a balanced output are formed in the same shape in terms of both line length and line width, the pair of wiring patterns are subject to design limitations and therefore design flexibility is reduced. Thus, it is difficult to make the high-frequency module compact. In addition, the design load may be increased.

Additionally, even if the line lengths and the line widths are the same, as illustrated in FIG. 1B, the phase shift may actually deviate from 180°, resulting in occurrence of transmission loss.

SUMMARY OF THE INVENTION

Preferred embodiments of the present invention provide a high-frequency module having a structure including balanced terminals, with high design flexibility and good transmission characteristics.

A preferred embodiment of the present invention provides a high-frequency module including a high-frequency device including balanced terminals, and a layered body having the high-frequency device mounted thereon and including balanced-output external connection ports to be connected to the balanced terminals. The layered body of the high-frequency module includes a first routing pattern and a second routing pattern that connect the balanced terminals and the balanced-output external connection ports to each other. The first routing pattern and the second routing pattern preferably have shapes such that characteristic impedances thereof are the same or substantially the same.

Figure 5:
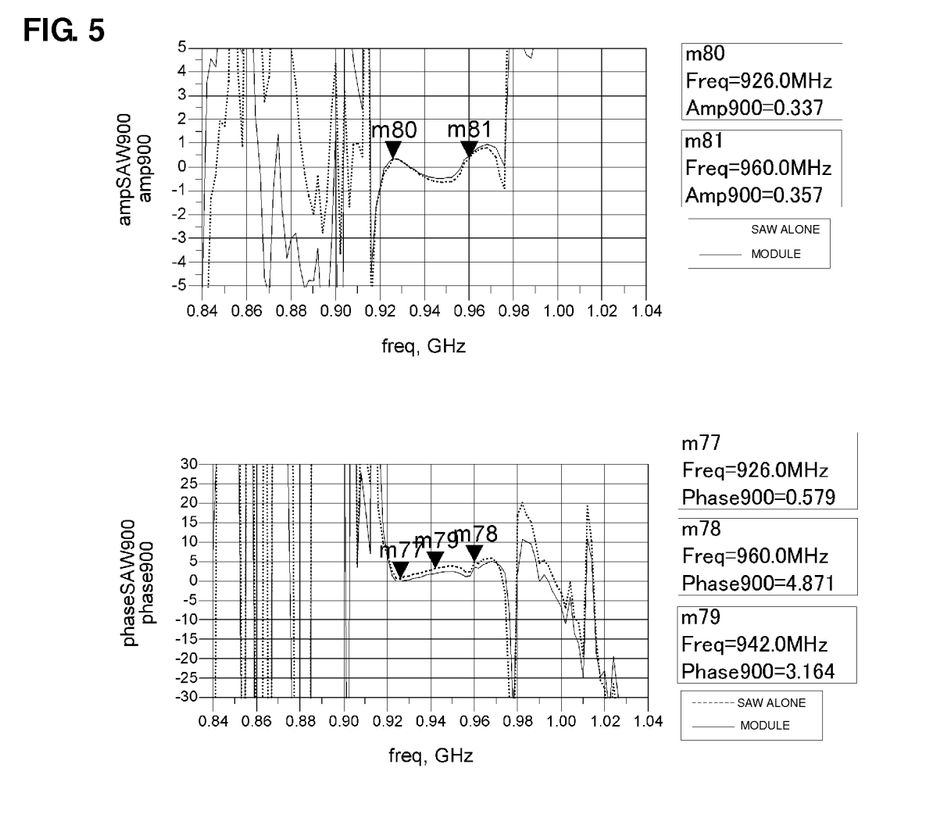
FIG. 5 includes diagrams illustrating the amplitude characteristics and phase characteristics of a SAW duplexer (SAW filter) for a GSM 900 reception signal, and the amplitude characteristics and phase characteristics of the high-frequency module when the configuration according to a preferred embodiment of the present invention is used.

In this configuration, the characteristic impedances of two transmission lines that connect the balanced terminals and the balanced-output external connection ports to each other are the same or substantially the same. Thus, as illustrated in FIG. 5, described below, no amplitude attenuation or phase deviation due to transmission occurs. In this case, unlike the related art, there is no need to make two routing patterns have the same line width and the same line length. Therefore, the routing patterns can be designed with higher flexibility. Since design flexibility is improved, the high-frequency module can be more easily made compact.

Further, in the high-frequency module according to a preferred embodiment of the present invention, at least a portion of the first routing pattern and at least a portion of the second routing pattern are located on different layers of the layered body.

In this configuration, a specific configuration of the first routing pattern and the second routing pattern is given. In this manner, at least portions of the first and second routing patterns are located on different layers, resulting in more improved design flexibility and making it possible to easily reduce size.

Further, in the high-frequency module according to a preferred embodiment of the present invention, the first routing pattern and the second routing pattern preferably have different pattern widths.

In this configuration, a specific configuration of the first routing pattern and the second routing pattern is given. In this manner, the pattern widths of the respective routing patterns are preferably different, and thus the characteristic impedances of the patterns can be easily made the same even if the patterns have different lengths.

Further, in the high-frequency module according to a preferred embodiment of the present invention, the first routing pattern and the second routing pattern are disposed on a mounting surface on which the high-frequency device is mounted. Electrode patterns defining other circuit elements and other wiring patterns, which constitute the high-frequency module, are located on a principal surface facing the mounting surface.

In this configuration, the first routing pattern and the second routing pattern are spaced apart from electrode patterns defining other circuit elements and other wiring patterns, which constitute the high-frequency module, in the layered body. Therefore, the electromagnetic coupling between the first routing pattern and the second routing pattern and the electrode patterns defining other circuit elements and the other wiring patterns, which constitute the high-frequency module, can be significantly reduced and prevented.

Further, in the high-frequency module according to a preferred embodiment of the present invention, the first routing pattern and the second routing pattern are located between the mounting surface on which the high-frequency device is mounted and a first inner layer ground electrode located in the layered body.

In this configuration, the first routing pattern and the second routing pattern are located between the mounting surface on which the high-frequency device is mounted and the first inner layer ground electrode, thus facilitating the design of the capacitance of the first routing pattern and the second routing pattern and further facilitating the design of the characteristic impedances.

Further, in the high-frequency module according to a preferred embodiment of the present invention, the layered body has mounted thereon a switch IC having a common terminal and individual terminals such that connections of the common terminal to the individual terminals are switched. The high-frequency device preferably is a SAW device having an unbalanced-balanced conversion function, the SAW device including an unbalanced terminal connected to one of the individual terminals and including the balanced terminals. The electrode patterns defining other circuit elements and the other wiring patterns constitute a filter circuit connected to an individual terminal different from the individual terminal to which the SAW device is connected. In the high-frequency module, furthermore, the filter circuit preferably is a transmitting circuit, the SAW device preferably is a receiving circuit, and an antenna-side circuit is on the common terminal side of the switch IC.

In this configuration, a more specific example configuration of the high-frequency module is given, in which a high-frequency switch module that transmits and receives a plurality of communication signals by switching them using a common antenna is achieved.

Further, in the high-frequency module according to a preferred embodiment of the present invention, two input/output electrodes constituting the balanced terminals of the high-frequency device are arranged along a certain side surface of the high-frequency device so as to be parallel or substantially parallel to and close to the side surface. In the high-frequency module, furthermore, two external-connection electrodes constituting the balanced-output external connection ports are arranged along a certain side surface of the layered body so as to be parallel or substantially parallel to and close to the side surface.

This configuration gives a specific configuration of the high-frequency device and the layered body. Even in this configuration, the flexibility of the routing patterns is high. Thus, the direction in which the two input/output electrodes constituting the balanced terminals of the high-frequency device are arranged and the direction in which the two external-connection electrodes constituting the balanced-output external connection ports are arranged can be set as desired. Therefore, the flexibility in the shape of the high-frequency module is improved, and the high-frequency module can be made compact.

Further, in the high-frequency module according to a preferred embodiment of the present invention, the high-frequency device includes a first balanced terminal and a second balanced terminal which are different from each other. A direction in which a main line portion of a routing pattern connected to the first balanced terminal extends is perpendicular or substantially perpendicular to a direction in which a main line portion of a routing pattern connected to the second balanced terminal extends.

In this configuration, a specific configuration of the high-frequency device used in the high-frequency module is given. Using the improved flexibility of the routing patterns described above, when the high-frequency device includes a first balanced terminal and a second balanced terminal, the directions in which the main line portions of the routing patterns for the respective balanced terminals extend are made perpendicular or substantially perpendicular, resulting in the electromagnetic coupling between the routing patterns being significantly reduced and prevented, and the isolation between the routing patterns being improved.

According to various preferred embodiments of the present invention, a high-frequency module that achieves balanced output, with high design flexibility and good transmission characteristics, is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
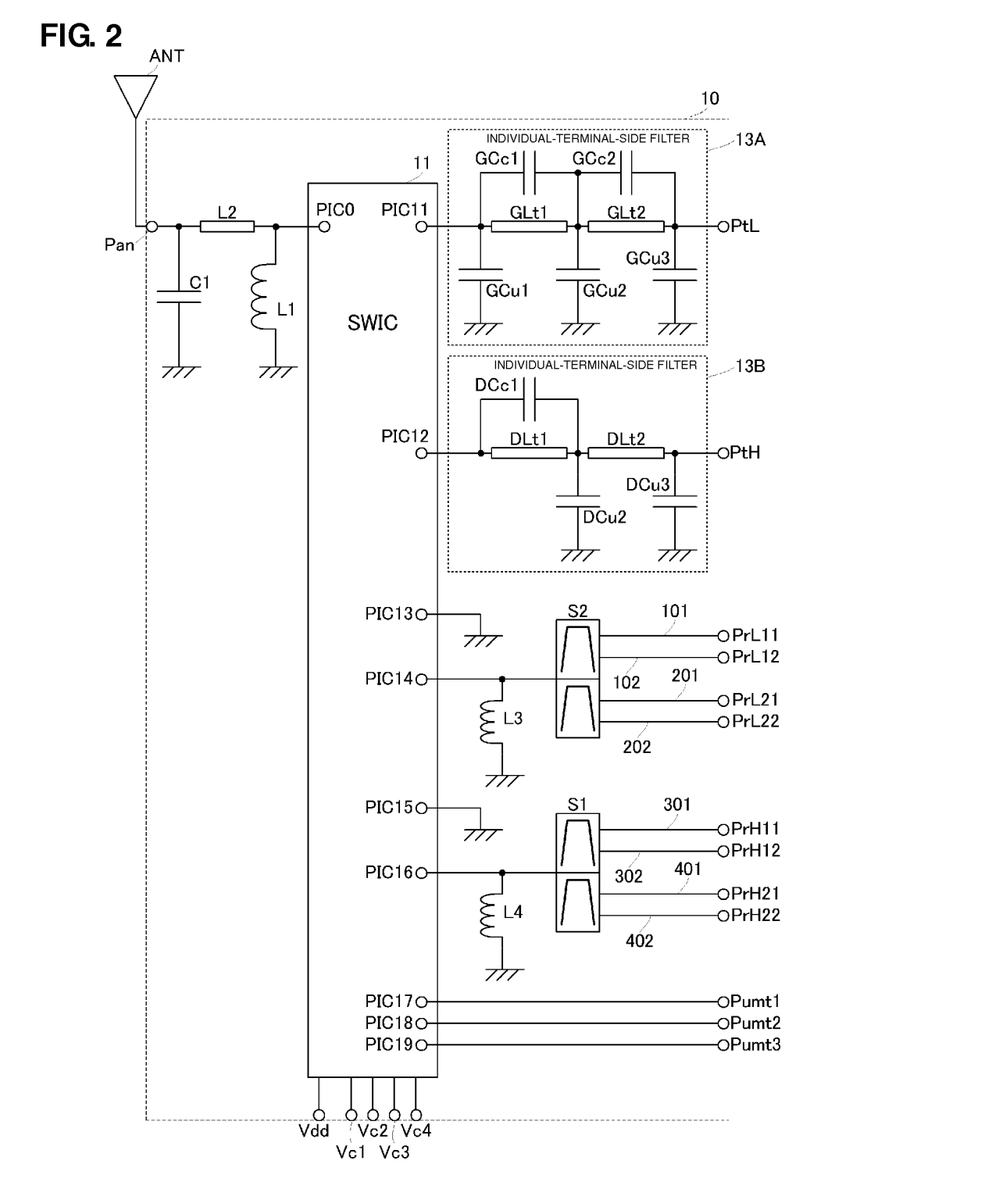
FIG. 2 is a circuit diagram of a high-frequency switch module of according to a preferred embodiment of the present invention.

A high-frequency module according to preferred embodiments of the present invention will be described with reference to the drawings. In a preferred embodiment of the present invention, a high-frequency module will be described in the context of, by way of example, a high-frequency switch module that includes a SAW duplexer having an unbalanced-balanced conversion function and that transmits and receives GSM 850, GSM 900, GSM 1800, and GSM 1900 communication signals. FIG. 2 is a circuit diagram of the high-frequency switch module of this preferred embodiment.

A high-frequency module 10 preferably includes a switch IC 11, SAW duplexers S1 and S2, and individual-terminal-side filters 13A and 13B, and includes circuit elements located in a layered body and circuit elements mounted on the top surface of the layered body. The switch IC 11 and the SAW duplexers S1 and S2 are mounted-type circuit elements, and are mounted on the top surface of the layered body. Here, each of the SAW duplexers S1 and S2 corresponds to a "high-frequency device" according to a preferred embodiment of the present invention. The individual-terminal-side filters 13A and 13B are schematically constituted by inductors and capacitors.

The switch IC 11 includes a common terminal PICO and a plurality of (in this preferred embodiment, nine, for example) individual terminals PIC11 to PIC19. The switch IC 11 is supplied with a drive voltage Vdd and control voltages Vc1, Vc2, Vc3, and Vc4. The switch IC 11 is driven by the drive voltage Vdd applied thereto to connect the common terminal PICO to one of the individual terminals PIC11 to PIC19 in accordance with a combination of high and low levels of the control voltages Vc1, Vc2, Vc3, and Vc4.

The common terminal PICO of the switch IC 11 is connected to an antenna port Pan of the high-frequency module 10 via an ESD protection circuit which also serves as a phase matching circuit and which includes an inductor L2, an inductor L1, and a capacitor C1.

The individual terminal PIC11 of the switch IC 11 is connected to a first transmission signal input port PtL of the high-frequency module 10 via the individual-terminal-side filter 13A. A GSM 850 transmission signal or a GSM 900 transmission signal is input to the first transmission signal input port PtL.

The individual terminal PIC12 of the switch IC 11 is connected to a second transmission signal input port PtH of the high-frequency module 10 via the individual-terminal-side filter 13B. A GSM 1800 transmission signal or a GSM 1900 transmission signal is input to the second transmission signal input port PtH, for example.

Here, the configuration of the individual-terminal-side filters 13A and 13B will be described.

The individual-terminal-side filter 13A includes inductors GLt1 and GLt2 connected in series between the individual terminal PIC11 and the first transmission signal input port PtL. A capacitor GCc1 is connected in parallel to the inductor GLt1, and a capacitor GCc2 is connected in parallel to the inductor GLt2. The side of the inductor GLt1 which is close to the individual terminal PIC11 is connected to the ground via a capacitor GCu1. A connection node between the inductor GLt1 and the inductor GLt2 is connected to the ground via a capacitor GCu2. The side of the inductor GLt2 which is close to the first transmission signal input port PtL is connected to the ground via a capacitor GCu3.

With the configuration described above, the individual-terminal-side filter 13A defines and functions as a low pass filter. In this case, the shapes of the respective circuit elements, namely, the inductors GLt1 and GLt2 and the capacitors GCc1, GCc2, GCu1, GCu2, and GCu3, are set as appropriate, and the values of the elements are determined to provide the desired values. Thus, a low pass filter can be provided to attenuate the second, third, and higher harmonics of the GSM 850 transmission signal and the GSM 900 transmission signal and which allows the fundamental frequency of the GSM 850 transmission signal and the GSM 900 transmission signal to pass therethrough. Therefore, harmonics of the GSM 850 transmission signal and GSM 900 transmission signal input from the first transmission signal input port PtL are blocked, and only the fundamental frequency signals of the GSM 850 transmission signal and the GSM 900 transmission signal are input to the individual terminal PIC11 of the switch IC 11.

The individual-terminal-side filter 13B includes inductors DLt1 and DLt2 connected in series between the individual terminal PIC12 and the second transmission signal input port PtH. A capacitor DCc1 is connected in parallel to the inductor DLt1. A connection node between the inductor DLt1 and the inductor DLt2 is connected to the ground via a capacitor DCu2. The side of the inductor DLt2 which is close to the second transmission signal input port PtH is connected to the ground via a capacitor DCu3.

With the configuration described above, the individual-terminal-side filter 13B defines and functions as a low pass filter. In this case, the shapes of the respective circuit elements, namely, the inductors DLt1 and DLt2 and the capacitors DCc1, DCu2, and DCu3, are set as appropriate, and the values of the elements are determined to provide the desired values. Thus, a low pass filter can be provided to attenuate the second, third, and higher harmonics of the GSM 1800 transmission signal and the GSM 1900 transmission signal and which allows the fundamental frequency of the GSM 1800 transmission signal and the GSM 1900 transmission signal to pass therethrough. Therefore, harmonics of the GSM 1800 transmission signal and GSM 1900 transmission signal input from the second transmission signal input port PtH are blocked, and only the fundamental frequency signals of the GSM 1800 transmission signal and the GSM 1900 transmission signal are input to the individual terminal PIC12 of the switch IC 11.

The individual terminals PIC13 and PIC15 of the switch IC 11 are connected to the ground potential.

An unbalanced terminal of the SAW duplexer S2 is connected to the individual terminal PIC14 of the switch IC 11. A matching inductor L3 is connected between a line that connects the individual terminal PIC14 and the unbalanced terminal of the SAW duplexer S2 to each other and the ground potential.

The SAW duplexer S2 includes a first SAW filter having a pass band of a GSM 850 reception signal band and a second SAW filter having a pass band of a GSM 900 reception signal band, each of which has an unbalanced-balanced conversion function. In the SAW duplexer S2, a GSM 850 reception signal input from the unbalanced terminal is output from balanced terminals of the first SAW filter, and is attenuated by the second SAW filter. In the SAW duplexer S2, a GSM 900 reception signal input from the unbalanced terminal is attenuated by the first SAW filter, and is output from balanced terminals of the second SAW filter.

Two terminals constituting the balanced terminals of the first SAW filter of the SAW duplexer S2 are connected to first reception signal output ports PrL11 and PrL12 of the high-frequency module 10 via wiring patterns 101 and 102, respectively. The first reception signal output ports PrL11 and PrL12 correspond to "balanced-output external connection ports" according to a preferred embodiment of the present invention. The wiring patterns 101 and 102 are preferably arranged so that the characteristic impedances thereof match, the detailed structure of which will be described below.

Two terminals constituting the balanced terminals of the second SAW filter of the SAW duplexer S2 are connected to second reception signal output ports PrL21 and PrL22 of the high-frequency module 10 via wiring patterns 201 and 202, respectively. The second reception signal output ports PrL21 and PrL22 also correspond to the "balanced-output external connection ports" according to a preferred embodiment of the present invention. The wiring patterns 201 and 202 are preferably arranged so that the characteristic impedances thereof match, the detailed structure of which will be described below.

An unbalanced terminal of the SAW duplexer S1 is connected to the individual terminal PIC16 of the switch IC 11. A matching inductor L4 is connected between a line that connects the individual terminal PIC16 and the unbalanced terminal of the SAW duplexer S1 to each other and the ground potential.

The SAW duplexer S1 includes a third SAW filter having a pass band of a GSM 1800 reception signal band and a fourth SAW filter having a pass band of a GSM 1900 reception signal band, each of which has an unbalanced-balanced conversion function. In the SAW duplexer S1, a GSM 1800 reception signal input from the unbalanced terminal is output from balanced terminals of the third SAW filter, and is attenuated by the fourth SAW filter. In the SAW duplexer S1, a GSM 1900 reception signal input from the unbalanced terminal is attenuated by the third SAW filter, and is output from balanced terminals of the fourth SAW filter.

Two terminals constituting the balanced terminals of the third SAW filter of the SAW duplexer S1 are connected to third reception signal output ports PrH11 and PrH12 of the high-frequency module 10 via wiring patterns 301 and 302, respectively. The third reception signal output ports PrH11 and PrH12 also correspond to the "balanced-output external connection ports" according to a preferred embodiment of the present invention. The wiring patterns 301 and 302 are preferably arranged so that the characteristic impedances thereof match, the detailed structure of which will be described below.

Two terminals constituting the balanced terminals of the fourth SAW filter of the SAW duplexer S1 are connected to fourth reception signal output ports PrH21 and PrH22 of the high-frequency module 10 via wiring patterns 401 and 402, respectively. The fourth reception signal output ports PrH21 and PrH22 also correspond to the "balanced-output external connection ports" according to a preferred embodiment of the present invention. The wiring patterns 401 and 402 are preferably arranged so that the characteristic impedances thereof match, the detailed structure of which will be described below.

The individual terminals PIC17, PIC18, and PIC19 of the switch IC 11 are connected to first, second, and third input/output ports Pumt1, Pumt2, and Pumt3, respectively.

Figure 3:
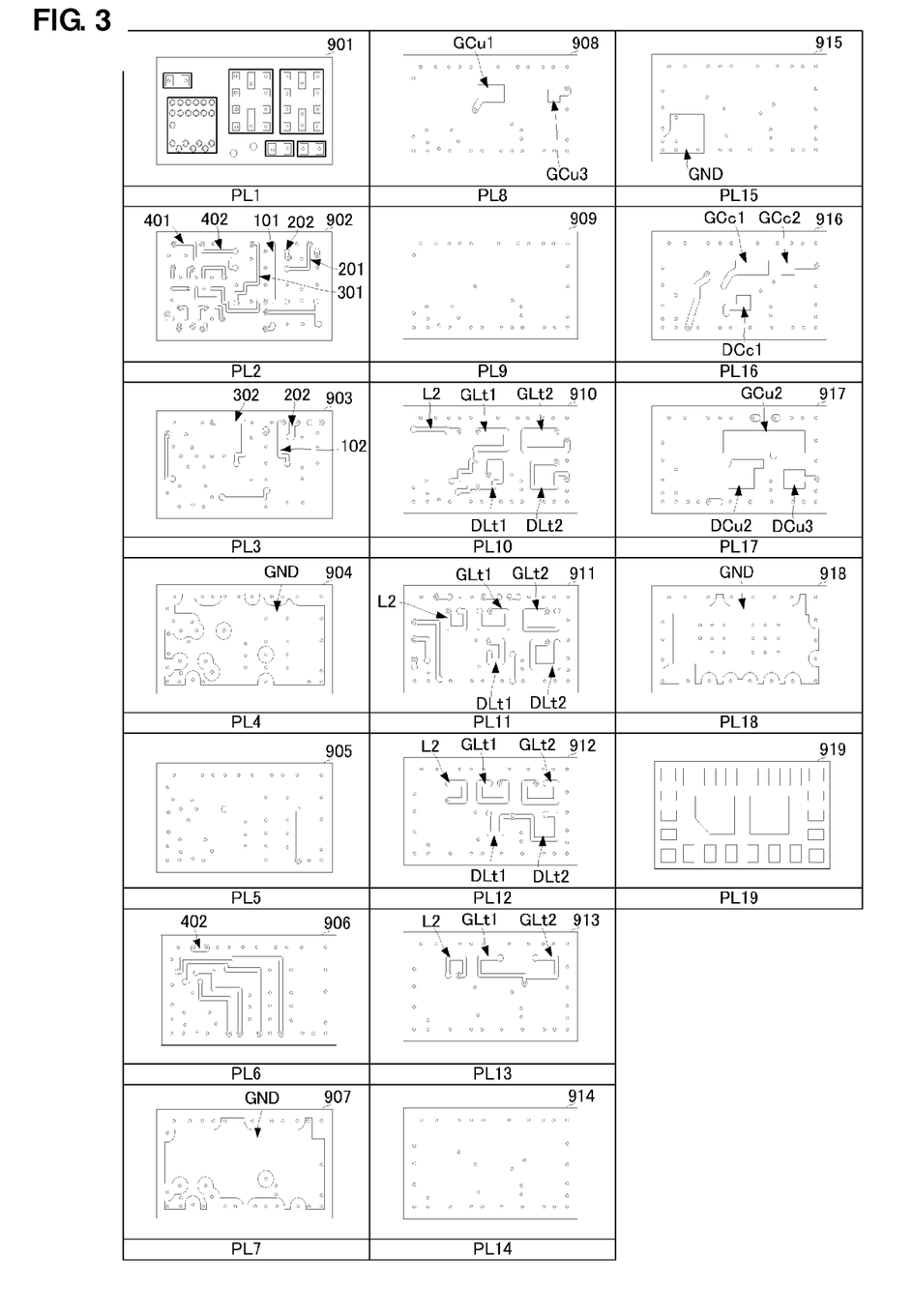
FIG. 3 is a layered diagram of a high-frequency module according to a preferred embodiment of the present invention.
Figure 4A:
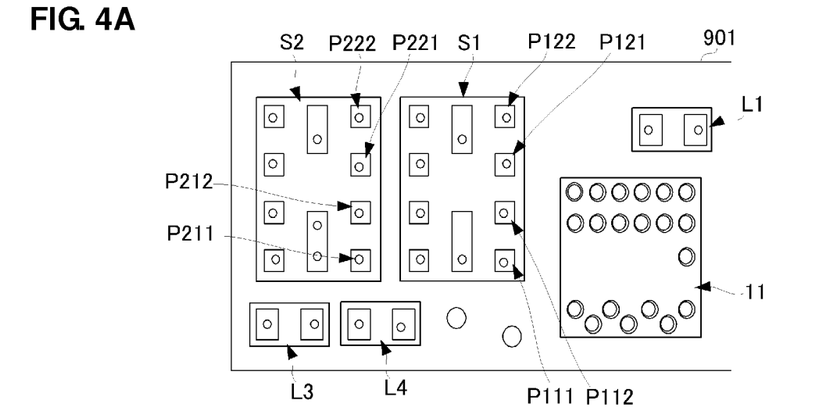
FIGS. 4A and 4B include a diagram of the configuration mounted on the top surface of a layered body 900, and a configuration diagram of external connection lands on the bottom surface of the layered body 900.
Figure 4B:
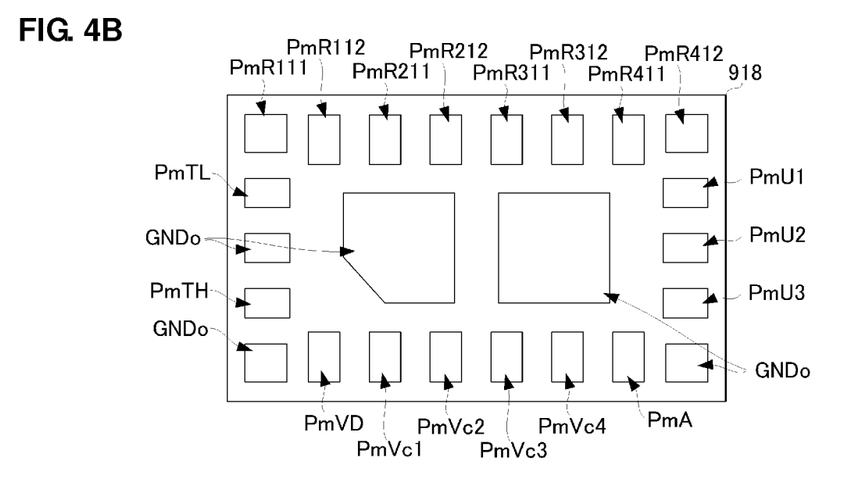

The high-frequency module 10 having the circuit configuration described above includes a layered body 900 that is preferably formed by stacking a plurality of dielectric layers PL1 to PL19, and various mounted-type circuit elements mounted on the top surface of the layered body 900. FIG. 3 is a layered diagram of the high-frequency module of this preferred embodiment. FIG. 3 is a diagram illustrating an electrode pattern in plan view from the bottom, where the top layer located on the top-surface side of the layered body 900 is represented by a first layer PL1 and the bottom layer is represented by a nineteenth layer PL19, for example. In FIG. 3, circles indicated in each layer represent conductive via holes connecting layers. FIG. 4A is a diagram of the configuration mounted on the top surface of the layered body 900, and FIG. 4B is a diagram of the configuration of external connection lands on the bottom surface of the layered body 900.

The first layer PL1 (dielectric layer 901) includes thereon mounting lands on which the switch IC 11, the SAW duplexers S1 and S2, and the inductors L1, L3, and L4 are to be mounted. The mounting lands are located on the top-surface side of the dielectric layer 901.

Here, the mounting lands for the SAW duplexers S1 and S2 are arranged so that the short-side direction of the SAW duplexers S1 and S2 is parallel or substantially parallel to the long-side direction of the layered body 900. Further, the mounting lands for the SAW duplexer S1 are arranged so that balanced-terminal lands P111 and P112 and balanced-terminal lands P121 and P122 are parallel or substantially parallel to the short-side direction of the layered body 900. Also, the mounting lands for the SAW duplexer S2 are arranged so that balanced-terminal lands P211 and P212 and balanced-terminal lands P221 and P222 are parallel or substantially parallel to the short-side direction of the layered body 900.

With the configuration described above, the SAW duplexers S1 and S2 are mounted on the layered body 900 so that the short-side direction of each of the SAW duplexers S1 and S2 is parallel or substantially parallel to the long-side direction of the layered body 900.

Thus, the area of the SAW duplexers S1 and S2 in plan view can be made smaller than that of the related art when, as illustrated in FIG. 1A, the SAW duplexers S1 and S2 are mounted on the layered body 900 so that the long-side direction of the SAW duplexers S1 and S2 is parallel or substantially parallel to the long-side direction of the layered body 900. Therefore, the high-frequency module 10 can be compact. The reason why the flexibility of the arrangement of the SAW duplexers S1 and S2 can be increased is that, as described below, the flexibility of the routing of the SAW duplexers S1 and S2 from the balanced-terminal lands P111, P112, P121, P122, P211, P212, P221, and P222 is improved.

The second layer PL2 (dielectric layer 902) includes thereon linear routing electrodes which respectively constitute the wiring patterns 101, 201, 202, 301, 401, and 402. The wiring pattern 101 is connected to the balanced-terminal land P211 through a conductive via hole. The wiring pattern 201 is connected to the balanced-terminal land P221 through a conductive via hole. The wiring pattern 202 is connected to the balanced-terminal land P222 through a conductive via hole. The wiring pattern 301 is connected to the balanced-terminal land P111 through a conductive via hole. The wiring pattern 401 is connected to the balanced-terminal land P121 through a conductive via hole. The wiring pattern 402 is connected to the balanced-terminal land P122 through a conductive via hole.

The third layer PL3 (dielectric layer 903) includes thereon linear routing electrodes which respectively constitute the wiring patterns 102, 202, and 302. The wiring pattern 102 is connected to the balanced-terminal land P212 through a conductive via hole. The wiring pattern 202 is connected to the wiring pattern 202 on the second layer PL2 through a conductive via hole. The wiring pattern 302 is connected to the balanced-terminal land p112 through a conductive via hole.

The fourth layer PL4 (dielectric layer 904) includes an inner layer ground electrode GND arranged substantially on the entire surface thereof.

The fifth layer PL5 (dielectric layer 905) includes thereon a routing electrode for an antenna-side circuit.

The sixth layer PL6 (dielectric layer 906) includes thereon a linear routing electrode which constitutes the wiring pattern 201. A wiring pattern 402 is connected to the wiring pattern 402 on the second layer PL2 through a conductive via hole. The sixth layer (dielectric layer 906) further includes thereon routing electrodes for control voltages.

The seventh layer PL7 (dielectric layer 907) includes an inner layer ground electrode GND arranged substantially on the entire surface thereof.

The individual-terminal-side filters 13A and 13B described above and the respective circuit elements which constitute the components on the antenna side, other than the inductor L1 for ESD protection which also serves as a phase matching circuit, are formed preferably by using inner layer electrode patterns on the layers from the eighth layer PL8 (dielectric layer 908) to the seventeenth layer PL17 (dielectric layer 917), for example.

The eighteenth layer PL18 (dielectric layer 918) includes an inner layer ground electrode GND arranged substantially on the entire surface thereof.

The nineteenth layer PL19 (dielectric layer 919) which constitutes the bottom surface of the layered body 900 includes various external connection lands located on the bottom-surface side thereof. As illustrated in FIG. 4B, external-connection ground electrodes GNDo are located in the center or approximate center of the dielectric layer 919 in plan view.

Balanced-output external connection lands PmR111, PmR112, PmR211, PmR212, PmR311, PmR312, PmR411, and PmR412 corresponding to the respective balanced-output external connection ports are located near one side extending along the long-side direction of the dielectric layer 919 so as to be arranged along the long-side direction. The balanced-output external connection lands PmR111, PmR112, PmR211, PmR212, PmR311, PmR312, PmR411, and PmR412 are external connection lands corresponding to the first reception signal output ports PrL11 and PrL12, the second reception signal output ports PrL21 and PrL22, the third reception signal output ports PrH11 and PrH12, and the fourth reception signal output ports PrH21 and PrH22 in FIG. 2, respectively.

The balanced-output external connection lands PmR111, PmR112, PmR211, PmR212, PmR311, PmR312, PmR411, and PmR412 are connected to the wiring patterns 101, 102, 201, 202, 301, 302, 401, and 402 through conductive via holes, respectively, to achieve the circuit in FIG. 2.

External connection lands PmVD, PmVc1, PmVc2, PmVc3, PmVc4, and PmA are located near the other side extending along the long-side direction of the dielectric layer 919 so as to be arranged along the long-side direction. The external connection lands PmVD, PmVc1, PmVc2, PmVc3, and PmVc4 are external connection lands (corresponding to Vdd, Vc1, Vc2, Vc3, and Vc4 in FIG. 2) that apply the drive voltage Vdd and the control voltages Vc1 to Vc4, and the external connection land PmA is an external connection land corresponding to the antenna port Pan in FIG. 2.

External connection lands PmTL and PmTH are located near one side extending along the short-side direction of the dielectric layer 919 so as to be located along the short-side direction. The external connection lands PmTL and PmTH are external connection lands corresponding to the first transmission signal input port PtL and the second transmission signal input port PtH.

External connection lands PmU1, PmU2, and PmU3 are located near the other side extending along the short-side direction of the dielectric layer 919 so as to be arranged along the short-side direction. The external connection lands PmU1, PmU2, and PmU3 are external connection lands corresponding to the first, second, and third input/output ports Pumt1, Pumt2, and Pumt3.

With the structure described above, the high-frequency module 10 including the layered body 900 and the mounting circuit components to be mounted on the layered body 900 is provided.

In this structure, the high-frequency module 10 of this preferred embodiment preferably further includes the following features.

The respective routing electrodes which constitute the wiring patterns 101 and 102 are arranged so that the characteristic impedances of the wiring patterns 101 and 102 match by setting the wiring electrode lengths and wiring electrode widths of the routing electrodes as desired.

Also, the respective routing electrodes which constitute the wiring patterns 201 and 202 are arranged so that the characteristic impedances of the wiring patterns 201 and 202 match by setting the wiring electrode lengths and wiring electrode widths of the routing electrodes as desired.

In addition, similarly, the respective routing electrodes which constitute the wiring patterns 301 and 302 are arranged so that the characteristic impedances of the wiring patterns 301 and 302 match by setting the wiring electrode lengths and wiring electrode widths of the routing electrodes as desired.

Additionally, similarly, the respective routing electrodes which constitute the wiring patterns 401 and 402 are arranged so that the characteristic impedances of the wiring patterns 401 and 402 match by setting the wiring electrode lengths and wiring electrode widths of the routing electrodes as desired.

In this manner, the SAW duplexers S1 and S2 are designed such that the characteristic impedances of the wiring patterns to be connected to the balanced terminals connected to the SAW filters of each of the SAW duplexers S1 and S2 match. Thus, the characteristics illustrated in FIG. 5 can be achieved. FIG. 5 illustrates the amplitude characteristics and phase characteristics of a SAW filter for a GSM 900 reception signal, and the amplitude characteristics and phase characteristics of the high-frequency module when the configuration of this preferred embodiment is used.

As illustrated in FIG. 5, as described above, the wiring patterns are arranged so that the characteristic impedances match. Thus, no amplitude attenuation or phase deviation occurs after transmission over the wiring patterns, that is, at the time of output from the balanced-output external connection ports of the high-frequency module 10. Therefore, low-loss balanced output can be achieved.

In this way, in a case where the SAW duplexers S1 and S2 are designed such that the characteristic impedances of the wiring patterns to be connected to the balanced terminals connected to the SAW filters of each of the SAW duplexers S1 and S2 match, flexibility in design is improved compared to the case where, as in the related art, the wiring electrode lengths and the wiring electrode widths are made to completely match. Therefore, the design flexibility of the wiring patterns in the layered body 900 can be improved, and the layered body 900 can be made more compact. In addition, using this configuration, the high-frequency module 10 of this preferred embodiment is configured such that wiring patterns are arranged to extend across a plurality of dielectric layers. Therefore, the plan view shape of the layered body 900 can be further miniaturized.

Further, as described above, an inner layer ground electrode GND is located on a layer adjacent to the layer in which a routing electrode constituting a wiring pattern is located, and layers on which routing electrodes are located are interposed between the surface on which the SAW duplexers S1 and S2 are mounted and an inner layer ground electrode. Thus, the design of the capacitance generated between the ground potential and each wiring pattern can be facilitated, and the characteristic impedances can be more easily designed to be set to the desired values.

Further, as illustrated in FIG. 3, the main routing direction of the wiring patterns 301 and 302 which are routed from the balanced-terminal lands P111 and P112 for the respective SAW filters of the SAW duplexer S1 is parallel or substantially parallel to the short-side direction of the layered body 900, and the main routing direction of the wiring patterns 401 and 402 which are routed from the balanced-terminal lands P121 and P122 for the respective SAW filters of the SAW duplexer S1 is parallel or substantially parallel to the long-side direction of the layered body 900. Thus, the electromagnetic coupling between the wiring patterns 301 and 302 and the wiring patterns 401 and 402 can be significantly reduced and prevented. As a result, the isolation between the wiring patterns 301 and 302 and the wiring patterns 401 and 402 can be improved. Furthermore, since isolation can be ensured in this manner, the design of the characteristic impedances of the wiring patterns 301 and 302 and the wiring patterns 401 and 402 can be facilitated.

Further, as illustrated in FIG. 3, the balanced-output wiring patterns 101, 102, 201, 202, 301, 302, 401, and 402 are located on the second layer PL2 to the sixth layer PL6 of the layered body 900, and the electrode patterns of the other circuit elements to be provided in the layered body 900 constituting the high-frequency module 10 are located on the eighth layer PL8 to the eighteenth layer PL18. In addition to this, the inner layer ground electrode GND is located on the seventh layer PL7 between them. With this structure, the balanced-output wiring patterns 101, 102, 201, 202, 301, 302, 401, and 402 can be electrically isolated from the other circuit elements by the inner layer ground electrode GND. Therefore, the electromagnetic coupling between the balanced-output wiring patterns 101, 102, 201, 202, 301, 302, 401, and 402 and the other circuit elements can be significantly reduced and prevented, and the isolation therebetween can be improved.

Further, as illustrated in FIGS. 3 and 4, the balanced-terminal lands P111, P112, P121, P122, P211, P212, P221, and P222 for the SAW duplexers S1 and S2 may not necessarily be located at positions that overlap the positions of the balanced-output external connection lands PmR111, PmR112, PmR211, PmR212, PmR311, PmR312, PmR411, and PmR412 when the layered body 900 is viewed in plan. This is because, as described above, the wiring patterns 101 and 102, the wiring patterns 201 and 202, the wiring patterns 301 and 302, and the wiring patterns 401 and 402 may not necessarily have the same shape so long as the characteristic impedances can be designed to be set to the desired value.

Therefore, the design flexibility in the shape of the electrode patterns on the inner layers of the layered body 900, the patterns for defining and arranging the external connection lands, and the patterns for arranging the lands on which the SAW duplexers S1 and S2 are mounted is improved, and the layered body 900 can be designed to be more compact.

As described above, with the use of this preferred embodiment, a compact low-loss high-frequency module having balanced output terminals can be achieved.

In this preferred embodiment, a high-frequency module has been described in the context of a high-frequency switch module, by way of example. Any other high-frequency module having balanced output terminals may also have the configuration described above and can achieve advantageous effects similar to those described above.

In the foregoing description, by way of example, the mounting of two SAW duplexers S1 and S2 as high-frequency devices with balanced output has been described. However, a high-frequency module including at least one high-frequency device having balanced terminals, such as one SAW filter having balanced terminals, may have the configuration described above and can achieve advantageous effects similar to those described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a high-frequency device including balanced terminals; and
   a layered body having the high-frequency device mounted thereon and including balanced-output external connection ports to be connected to the balanced terminals; wherein
   the layered body includes a first routing pattern and a second routing pattern that connect the balanced terminals and the balanced-output external connection ports to each other;
   the first routing pattern and the second routing pattern have shapes such that characteristic impedances thereof are the same;
   the layered body includes a plurality of layers, each of the plurality of layers includes an upper principal surface and a lower principal surface, and the upper principal surface of an uppermost one of the plurality of layers defines a mounting surface on which the high-frequency device is mounted;
   electrode patterns defining circuit elements and wiring patterns, which constitute the high-frequency module, are located on the upper principal surface of at least one of the plurality of layers;
   the first routing pattern and the second routing pattern are located between the mounting surface and a first inner layer ground electrode located in the layered body;
   a position at which the first routing pattern and the second routing pattern are located overlaps a position at which the electrode patterns defining the circuit elements and the wiring patterns are located when the high-frequency device is viewed in a plan view; and
   the first inner layer ground electrode located in the layered body is located between the electrode patterns defining the circuit elements and the wiring patterns, and the first routing pattern and the second routing pattern in a thickness direction of the high frequency device.

2. The high-frequency module according to claim 1, wherein at least a portion of the first routing pattern and at least a portion of the second routing pattern are located on different layers of the layered body.

3. The high-frequency module according to claim 1, wherein the first routing pattern and the second routing pattern have different pattern widths.

4. The high-frequency module according to claim 1, wherein
   the layered body has mounted thereon a switch IC including a common terminal and individual terminals such that connections of the common terminal to the individual terminals are switched;
   the high-frequency device is a SAW device including an unbalanced-balanced conversion function, the SAW device including an unbalanced terminal connected to one of the individual terminals and including the balanced terminals;
   the electrode patterns defining the circuit elements and the wiring patterns constitute a filter circuit connected to an individual terminal different from the individual terminal to which the SAW device is connected; and
   the filter circuit is a transmitting circuit, the SAW device is a receiving circuit, and an antenna-side circuit is on the common terminal side of the switch IC.

5. The high-frequency module according to claim 1, wherein two input/output electrodes constituting the balanced terminals of the high-frequency device are arranged along a certain side surface of the high-frequency device so as to be parallel or substantially parallel to and adjacent to the side surface; and two external-connection electrodes constituting the balanced-output external connection ports are arranged along a certain side surface of the layered body so as to be parallel or substantially parallel to and adjacent to the side surface.

6. The high-frequency module according to claim 1, wherein
the balanced terminals includes a first balanced terminal and a second balanced terminal which are different from each other; and
a main routing direction in which the first routing pattern connected to the first balanced terminal extends is perpendicular or substantially perpendicular to a main routing direction in which the second routing pattern connected to the second balanced terminal extends.

7. The high-frequency module according to claim 1, wherein the high-frequency device is a SAW duplexer having an unbalanced-balanced conversion function.

8. The high-frequency module according to claim 1, wherein the high-frequency device transmits and receives GSM 850, GSM 900, GSM 1800 and GSM 1900 communication signals.

9. The high-frequency module according to claim 1, further comprising a switch IC and individual-terminal-side filters, wherein the high-frequency device includes two SAW duplexers.

10. The high-frequency module according to claim 9, wherein the individual-terminal-side filters include inductors and capacitors connected to each other.

11. The high-frequency module according to claim 9, wherein at least one of the individual-terminal-side filters is a low pass filter.

12. The high-frequency module according to claim 1, wherein the high-frequency device includes two SAW duplexers that are mounted on the layered body such that a short-side direction of each of the at least two SAW duplexers is parallel or substantially parallel to a long-side direction of the layered body.

13. The high-frequency module according to claim 1, further comprising additional pairs of routing patterns connecting additional balanced terminals, wherein each of the additional pairs of routing patterns have shapes such that characteristic impedances thereof are the same.

14. The high-frequency module according to claim 13, wherein at least a portion of a first routing pattern and at least a portion of a second routing pattern of each of the additional pairs of routing patterns are located on different layers of the layered body.

15. The high-frequency module according to claim 13, wherein each of the additional pairs of routing patterns have different pattern widths.

16. The high-frequency module according to claim 1, wherein the high-frequency module is a high-frequency switch module.

17. The high-frequency module according to claim 1, wherein the high-frequency device includes at least two SAW duplexers.

18. The high-frequency module according to claim 1, wherein the high-frequency device includes only one SAW duplexer.

19. The high-frequency module according to claim 1, wherein the first inner layer ground electrode is arranged substantially on an entire surface of one of the plurality of layers of the layered body in the plan view.

* * * * *